(12) United States Patent
Jeong et al.

(10) Patent No.: US 11,495,708 B2
(45) Date of Patent: Nov. 8, 2022

(54) METHOD OF FABRICATING SEE-THROUGH THIN FILM SOLAR CELL

(71) Applicant: KOREA INSTITUTE OF SCIENCE AND TECHNOLOGY, Seoul (KR)

(72) Inventors: Jeung Hyun Jeong, Seoul (KR); Hyeong Geun Yu, Seoul (KR); Jong Keuk Park, Seoul (KR); Won Mok Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/067,766

(22) Filed: Oct. 12, 2020

(65) Prior Publication Data
US 2021/0135041 A1 May 6, 2021

(30) Foreign Application Priority Data

Oct. 31, 2019 (KR) .................. 10-2019-0137907
Mar. 16, 2020 (KR) .................. 10-2020-0032026

(51) Int. Cl.
*H01L 31/18* (2006.01)
*H01L 31/0468* (2014.01)

(52) U.S. Cl.
CPC ...... *H01L 31/1896* (2013.01); *H01L 31/0468* (2014.12); *H01L 31/186* (2013.01); *H01L 31/1888* (2013.01)

(58) Field of Classification Search
CPC ............. H01L 31/0468; H01L 31/1896; H01L 31/186; H01L 31/1888
See application file for complete search history.

(56) References Cited

U.S. PATENT DOCUMENTS

2002/0011641 A1* 1/2002 Oswald ............... H01L 31/0468
257/447
2006/0196536 A1* 9/2006 Fujioka ............... H01L 31/0463
257/E27.125
(Continued)

FOREIGN PATENT DOCUMENTS

JP 2013-500867 A 1/2013
KR 10-2018-0098492 A 9/2018
(Continued)

OTHER PUBLICATIONS

Korean Office Action for KR Application No. 10-2020-0032026 dated Aug. 12, 2021.

*Primary Examiner* — Sadie White
(74) *Attorney, Agent, or Firm* — Cantor Colburn LLP

(57) ABSTRACT

Provided is a method of fabricating a see-through thin film solar cell, the method including preparing a substrate including a molybdenum (Mo) layer on one surface, forming see-through patterns by selectively removing at least parts of the Mo layer, sequentially depositing a chalcogenide absorber layer, a buffer layer, and a transparent electrode layer on the substrate and the Mo layer including the see-through patterns, and forming a see-through array according to a shape of the see-through patterns by removing the chalcogenide absorber layer, the buffer layer, and the transparent electrode layer deposited on the see-through patterns, by irradiating a laser beam from under the substrate toward the transparent electrode layer.

25 Claims, 17 Drawing Sheets

(56) References Cited

U.S. PATENT DOCUMENTS

| | | | | |
|---|---|---|---|---|
| 2011/0017280 A1* | 1/2011 | Rumsby | ............. | B23K 26/0626 |
| | | | | 136/251 |
| 2011/0139758 A1 | 6/2011 | Fan et al. | | |
| 2011/0265843 A1* | 11/2011 | Lee | ................... | H01L 31/0468 |
| | | | | 136/244 |
| 2013/0247969 A1* | 9/2013 | Kim | ................... | H01L 31/0468 |
| | | | | 438/98 |
| 2016/0126376 A1* | 5/2016 | Jeong | ................ | H01L 31/0463 |
| | | | | 136/256 |
| 2018/0108795 A1* | 4/2018 | Jeong | ................ | H01L 31/03923 |
| 2020/0279962 A1* | 9/2020 | Heiss | ................ | H01L 31/0465 |

FOREIGN PATENT DOCUMENTS

| KR | 10-2019-0000339 A | | 1/2019 | | |
|---|---|---|---|---|---|
| WO | WO-2019062739 A1 | * | 4/2019 | ......... | H01L 31/0465 |

* cited by examiner

1st Laser Etching

2$^{nd}$ Laser Etching

METHOD OF FABRICATING SEE-THROUGH THIN FILM SOLAR CELL

CROSS-REFERENCE TO RELATED PATENT APPLICATIONS

This application claims the benefit of Korean Patent Application No. 10-2019-0137907, filed on Oct. 31, 2019 and Korean Patent Application No. 10-2020-0032026, filed on Mar. 16, 2020, respectively, in the Korean Intellectual Property Office, the disclosure of which is incorporated herein in its entirety by reference.

BACKGROUND

1 Field

The present invention relates to a method of fabricating a thin film solar cell and, more particularly, to a method of fabricating a see-through thin film solar cell, the method being capable of implementing a high-efficiency chalcogenide thin film solar cell having transmittance.

2. Description of the Related Art

Chalcogenide thin film solar cells have excellent photovoltaic performance close to that of crystalline silicon solar cells and thus a $Cu(In,Ga)(Se,S)_2$ absorber layer thereof may achieve a photoelectric conversion efficiency of 23.4%. In addition, based on light weights, the chalcogenide thin film solar cells attract attention as a next-generation energy technology applicable to various environments. Particularly, when transmittance is given to the chalcogenide thin film solar cells having high-efficiency photovoltaic performance, growth of the high value-added solar energy market for power generation using windows of buildings, sunroofs of vehicles, etc. may be promoted.

Up to now, studies on transparent solar cells have been focused on dye-sensitized solar cells, organic solar cells, and amorphous silicon (a-Si) solar cells. To make the solar cells transparent, a method of transmitting visible light by controlling a bandgap of an absorber layer or a method of using an ultra-thin absorber layer to reduce absorbance has been used.

However, the above-mentioned solar cells have a low maximum photoelectric conversion efficiency of 10% to 15% and thus a technological level of the transparent solar cells hardly reaches an efficiency of 8% (at an average visible light transmittance of 30%). Furthermore, the dye-sensitized solar cells or the organic solar cells lack stability in materials and thus may not be easily used for solar power plants which require long-term use.

In addition to the method of using an ultra-thin absorber layer, a technology for fabricating light-transmitting solar cells by forming apertures in a high-efficiency chalcogenide layer has been reported. This technology gives transmittance by forming a plurality of apertures by mechanically scribing a fabricated solar cell thin film.

However, because the existing aperture-type chalcogenide thin film solar cell technology uses mechanical scribing, a light-transmitting region have a very large line width so as to be recognizable by the naked eye, aperture patterns are not precise, and thus product aesthetics are very low. For aesthetic light-transmitting solar cells, aperture patterns should not be recognizable by the naked eye and thus need to be formed to be equal to or less than a size (e.g., 100 um) recognizable by the naked eye at a certain distance.

SUMMARY

The present invention provides a method of fabricating a see-through thin film solar cell, the method being capable of implementing a chalcogenide thin film solar cell having both high-efficiency photovoltaic performance and transmittance. However, the scope of the present invention is not limited thereto.

According to an aspect of the present invention, there is provided a method of fabricating a see-through thin film solar cell.

The method may include preparing a substrate including a molybdenum (Mo) layer on a first surface, forming see-through patterns by selectively removing at least parts of the Mo layer, sequentially depositing a chalcogenide absorber layer, a buffer layer, and a transparent electrode layer on the substrate and on the Mo layer comprising the see-through patterns, and forming a see-through array according to a shape of the see-through patterns by removing the chalcogenide absorber layer, the buffer layer, and the transparent electrode layer deposited on the see-through patterns, by irradiating a laser beam from under the substrate toward the transparent electrode layer.

The forming of the see-through patterns may include selectively removing parts of the Mo layer through laser etching, and the laser etching may use a laser beam having a wavelength band transmittable through the substrate and absorbable into the Mo layer.

The forming of the see-through array may include removing parts of the chalcogenide absorber layer, the buffer layer, and the transparent electrode layer deposited on the see-through patterns, through laser etching, and the laser etching may use a laser beam having a wavelength band transmittable through the substrate and absorbable into the chalcogenide absorber layer.

An intensity of the laser beam used to form the see-through array may be less than threshold energy for simultaneously patterning the Mo layer, the chalcogenide absorber layer, the buffer layer, and the transparent electrode layer.

An intensity of the laser beam used to form the see-through array may be greater than threshold energy for simultaneously patterning the chalcogenide absorber layer, the buffer layer, and the transparent electrode layer deposited on the see-through patterns.

The forming of the see-through array may include forming the see-through array by having the laser beam incident on a second surface of the substrate, the second surface being opposite the first surface, and scanning the laser beam over a whole region of the substrate or a region around the see-through patterns.

The forming of the see-through array may include forming a plurality of see-through arrays by increasing a diameter of the laser beam to cover the plurality of see-through array and irradiating the laser beam once onto a whole region of the substrate or a region around the see-through patterns in a stitch manner within a range corresponding to the diameter of the laser beam.

The see-through array may include patterns of holes or lines.

A diameter of the holes or a width of the lines may be equal to or less than 200 μm (and greater than 0 μm).

A diameter of the holes or a width of the lines may be equal to or less than 100 μm (and greater than 0 μm).

The see-through patterns may be formed simultaneously with P1 scribing patterns for dividing the Mo layer into strips in an offset manner.

The method may further include forming P2 scribing patterns for dividing the chalcogenide absorber layer and the buffer layer into strips in an offset manner with respect to the P1 scribing patterns, by removing at least parts of the chalcogenide absorber layer and the buffer layer after the buffer layer is deposited.

The method may further include forming P3 scribing patterns for dividing the transparent electrode layer into strips in an offset manner with respect to the P2 scribing patterns, by removing at least parts of the transparent electrode layer after the transparent electrode layer is deposited.

The see-through array may be formed in a direction perpendicular to the P1, P2, and P3 scribing patterns.

The see-through array may be connected or partially disconnected from an end to another end of a module, and be formed in a band shape having a certain width.

The buffer layer may include one of cadmium sulfide (CdS), zinc oxysulfide (Zn(O,S)), tin-doped zinc oxide, titanium-doped zinc oxide, intrinsic zinc oxide (i-ZnO), magnesium-doped zinc oxide, and magnesium-aluminum-doped zinc oxide.

The transparent electrode layer may include one of indium-doped tin oxide (ITO), aluminum-doped zinc oxide (AZO), indium-doped zinc oxide (IZO), gallium-doped zinc oxide (GZO), boron-doped zinc oxide (BZO), silver (Ag) nanowires, graphene, carbon nanotubes, Ag, magnesium (Mg):Ag alloy, gold (Au), and an electrode material having a metal oxide/thin metal/metal oxide (OMO) structure.

The method may further include depositing a transparent oxide electrode layer on the Mo layer.

The transparent oxide electrode layer may include one or more of ITO, fluorine-doped tin oxide (FTO), AZO, IZO, GZO, indium-gallium-doped zinc oxide, (Al,Mg)-doped ZnOx, and BZO.

The method may further include depositing a transparent oxide electrode layer on the Mo layer, and the Mo layer may be in direct contact with the chalcogenide absorber layer in regions formed by selectively removing at least parts of the transparent oxide electrode layer.

The transparent oxide electrode layer may include contact holes.

The transparent oxide electrode layer may include ITO, AZO, IZO, GZO, or BZO.

The transparent oxide electrode layer may have a thickness of 0.1 nm to 5 nm.

The method may further include depositing a transparent oxide electrode layer between the substrate and the Mo layer.

The transparent oxide electrode layer may include one or more of ITO, fluorine-doped tin oxide (FTO), AZO, IZO, GZO, indium-gallium-doped zinc oxide, (Al,Mg)-doped ZnOx, and BZO.

According to another aspect of the present invention, there is provided a see-through thin film solar cell.

The see-through thin film solar cell may include a substrate including a molybdenum (Mo) layer on one surface, a chalcogenide absorber layer deposited on the Mo layer, a buffer layer deposited on the chalcogenide absorber layer, a transparent electrode layer deposited on the buffer layer, and a see-through array formed to penetrate through the Mo layer, the chalcogenide absorber layer, the buffer layer, and the transparent electrode layer by selectively removing at least parts of the Mo layer, the chalcogenide absorber layer, the buffer layer, and the transparent electrode layer.

The see-through thin film solar cell may further include a transparent oxide electrode layer deposited between the Mo layer and the chalcogenide absorber layer, and the transparent oxide electrode layer may include contact holes.

The see-through thin film solar cell may further include a transparent oxide electrode layer deposited between the substrate and the Mo layer.

The see-through array may include patterns of holes or lines.

A diameter of the holes or a width of the lines may be equal to or less than 200 μm (and greater than 0 μm).

A diameter of the holes or a width of the lines may be equal to or less than 100 μm (and greater than 0 μm).

The see-through array may be formed in a direction perpendicular to P1 scribing patterns for dividing the Mo layer into strips in an offset manner, P2 scribing patterns for dividing the chalcogenide absorber layer and the buffer layer into strips in an offset manner with respect to the P1 scribing patterns, and P3 scribing patterns for dividing the transparent electrode layer into strips in an offset manner with respect to the P2 scribing patterns.

The see-through array may be connected or partially disconnected from an end to another end of a module, and be formed in a band shape having a certain width.

The buffer layer may include one of cadmium sulfide (CdS), zinc oxysulfide (Zn(O,S)), tin-doped zinc oxide, titanium-doped zinc oxide, intrinsic zinc oxide (i-ZnO), magnesium-doped zinc oxide, and magnesium-aluminum-doped zinc oxide.

The transparent electrode layer may include indium-doped tin oxide (ITO), aluminum-doped zinc oxide (AZO), indium-doped zinc oxide (IZO), gallium-doped zinc oxide (GZO), boron-doped zinc oxide (BZO), silver (Ag) nanowires, graphene, carbon nanotubes, Ag, magnesium (Mg):Ag alloy, gold (Au), and an electrode material having a metal oxide/thin metal/metal oxide (OMO) structure.

The transparent oxide electrode layer may include one or more of ITO, fluorine-doped tin oxide (FTO), AZO, IZO, GZO, indium-gallium-doped zinc oxide, (Al,Mg)-doped ZnOx, and BZO.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

A method capable of implementing an aperture-type chalcogenide thin film solar cell by using a laser beam in a structure based on an opaque back contact using molybdenum (Mo) will now be described.

Figure 1A:
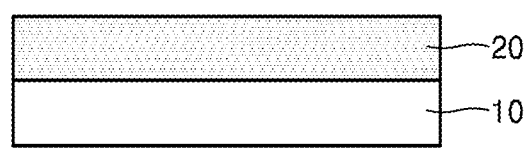
FIGS. 1A to 1D are cross-sectional views showing a process order of a method of fabricating a see-through thin film solar cell, according to an embodiment of the present invention.
Figure 1B:
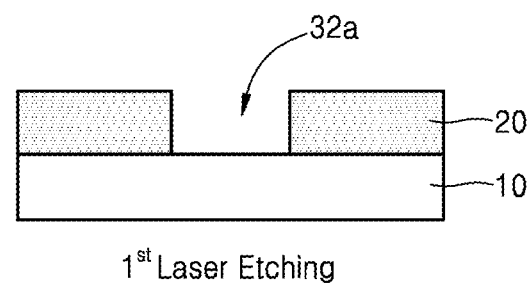
Figure 1C:
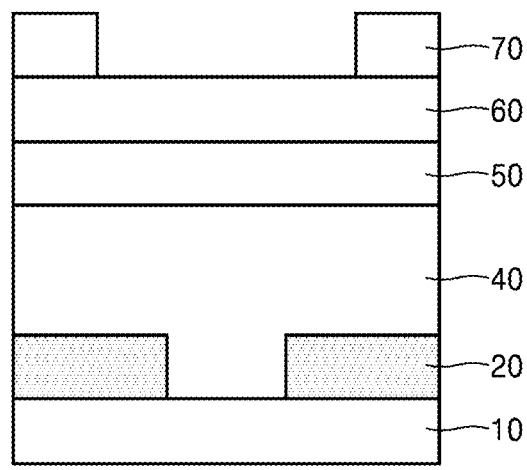
Figure 1D:
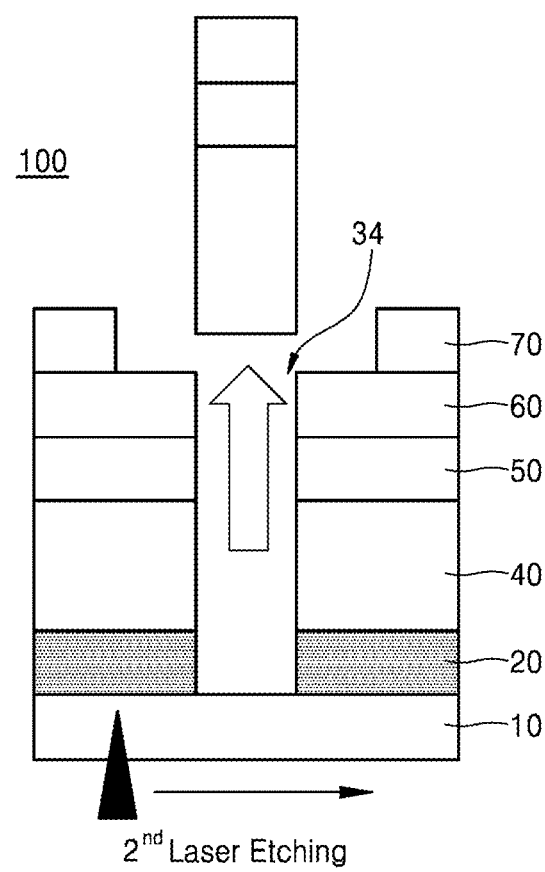
Figure 2A:
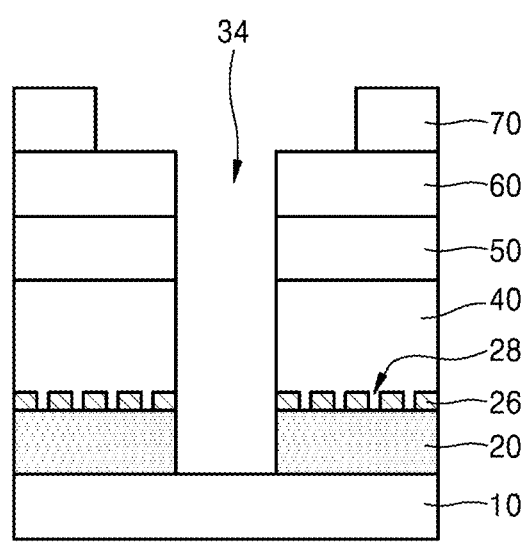
FIGS. 2A to 2C are cross-sectional views showing see-through thin film solar cell structures based on back contact layer types (FIG. 2A: a transparent conductive oxide (TCO)/molybdenum (Mo) structure, FIG. 2B: a TCO/Mo/TCO structure, and FIG. 2C: a Mo/TCO structure), according to an embodiment of the present invention.
Figure 2B:
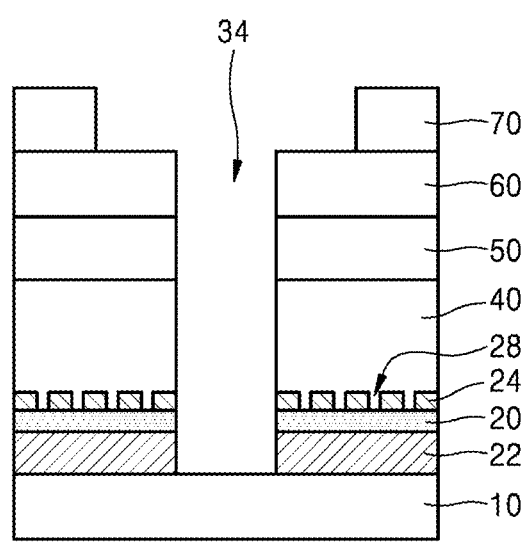
Figure 2C:
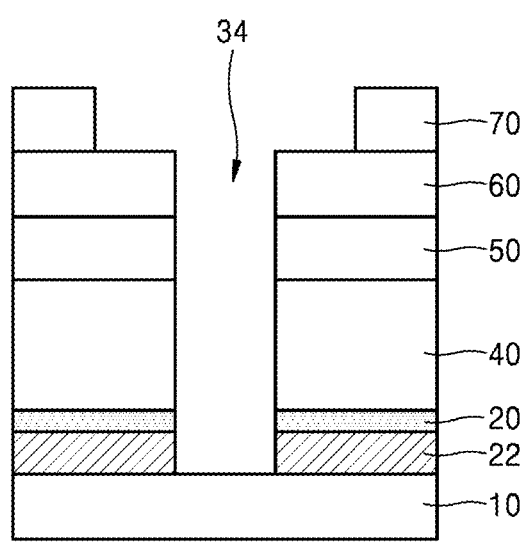

FIGS. 1A to 1D are cross-sectional views showing a process order of a method of fabricating a see-through thin film solar cell 100, according to an embodiment of the present invention, and FIGS. 2A to 2C are cross-sectional views showing see-through thin film solar cell structures based on back contact layer types (FIG. 2A: a transparent conductive oxide (TCO)/Mo structure, FIG. 2B: a TCO/Mo/TCO structure, and FIG. 2C: a Mo/TCO structure), according to an embodiment of the present invention.

Referring to FIGS. 1A and 1B, initially, a substrate 10 including a Mo layer 20 on one surface is prepared. Herein, the substrate 10 may use various materials such as glass and polymer, and more particularly, use a material capable of transmitting a laser beam in order to form see-through patterns 32a by using laser etching.

Then, the see-through patterns 32a are formed by selectively removing at least parts of the Mo layer 20 deposited on the substrate 10. The Mo layer 20 has high conductivity, and exhibits high corrosion resistance in, for example, a selenization process.

For example, the see-through patterns 32a use laser etching. The laser etching includes removing parts of the Mo layer 20. The laser etching uses a laser beam having a wavelength band not absorbable into but transmittable through the substrate 10 and absorbable into the Mo layer 20. Herein, due to the laser etching, the see-through patterns 32a may be formed simultaneously with P1 scribing patterns (not shown). The Mo layer 20 is divided into strips due to the P1 scribing patterns.

The see-through patterns 32a have a shape of holes or lines. A diameter of the holes or a width of the lines may be equal to or less than 200 μm (and greater than 0 μm). When the diameter of the holes or the width of the lines is greater than 200 μm, the holes or lines are recognizable by the naked eye and thus product aesthetics are poor. Therefore, the diameter of the holes or the width of the lines should be controlled to be equal to or less than 200 μm (and greater than 0 μm). However, considering optical and aesthetic properties of the thin film solar cell 100, the see-through patterns 32a having a size equal to or less than 100 μm (and greater than 0 μm) may be desirable.

As another example, for convenience of processes, the P1 scribing patterns and the see-through patterns 32a may be sequentially formed, or vice versa. In this case, the same laser beam source may be used or, in another case, different laser beam sources may be used.

The Mo layer 20 may be used as a monolayer or, in another case, a back contact layer in which two or more layers are stacked on one another by using a transparent electrode layer may be used. For example, the transparent electrode layer may include indium-doped tin oxide (ITO), fluorine-doped tin oxide (FTO), aluminum-doped zinc oxide (AZO), gallium-doped zinc oxide (GZO), or boron-doped zinc oxide (BZO) as transparent conductive oxide.

As another example, referring to FIG. 2A, a transparent oxide electrode layer 26 may be deposited on the Mo layer 20. As illustrated in FIG. 1B, the see-through patterns 32a may be formed through laser etching. The transparent oxide electrode layer 26 may increase an interfacial adhesion force between the Mo layer 20 and a chalcogenide absorber layer 40.

The transparent oxide electrode layer comprises one or more of ITO, fluorine-doped tin oxide (FTO), AZO, IZO, GZO, indium-gallium-doped zinc oxide, (Al,Mg)-doped ZnOx, and BZO.

The increase in the interfacial adhesion force between the Mo layer 20 and the chalcogenide absorber layer 40 by the transparent oxide electrode layer 26 increases durability against impact applied when the chalcogenide absorber layer 40 and other layers deposited on the see-through patterns 32a of the Mo layer 20 are removed due to laser etching. As such, for example, the chalcogenide absorber layer 40, a first buffer layer 50, and a transparent electrode layer 60 may be precisely removed according to the shape of the see-through patterns 32a previously formed in the Mo layer 20, and thus see-through laser etching quality may be increased.

In addition, the transparent oxide electrode layer 26 including contact holes 28 may not only increase the interfacial adhesion force between the Mo layer 20 and the chalcogenide absorber layer 40 but also form an interface having excellent carrier transport properties between the Mo layer 20 and the chalcogenide absorber layer 40 in the contact holes 28.

These contact holes 28 may be implemented by depositing the transparent oxide electrode layer 26 on the Mo layer 20 at a small thickness of 0.1 nm to 5 nm in the form of nano-sized islands instead of a continuous layer. For the nano-sized islands, in an early stage of a thin film deposition process, particles for configuring the transparent oxide electrode layer 26 clump together in clusters on the surface of the Mo layer 20, and the clusters serve as cores. In this case, because the clusters have a very small size, only parts of the Mo layer 20 are coated and a sufficient distance between the clusters is ensured.

Alternatively, in order to achieve a desired adhesion force, a time taken to deposit the transparent oxide electrode layer 26 may be increased to increase the size and thickness of the clusters and, when the thin film deposition process is continued due to aggregation of the clusters, most of the surface of the Mo layer 20 except for channel-shaped spaces thereon is coated due to the increase in size of the particles and aggregation of the particles and thus a continuous transparent oxide electrode layer 26 is deposited.

Otherwise, the time taken to deposit the transparent oxide electrode layer 26 may be further increased to fully deposit the transparent oxide electrode layer 26 on the Mo layer 20 and then the contact holes 28 may be formed by removing at least parts of the transparent oxide electrode layer 26 through an etching process.

As another example, referring to FIG. 2B, a transparent oxide electrode layer 22 may be further deposited between the substrate 10 and the Mo layer 20 in addition to a transparent oxide electrode layer 24 deposited on the Mo layer 20. That is, a back contact layer in which the transparent oxide electrode layer 22, the Mo layer 20, and the transparent oxide electrode layer 24 are sequentially stacked on one another may be deposited on the substrate 10, and the see-through patterns 32a may be formed through laser etching as illustrated in FIG. 1B.

In this case, an interfacial adhesion force between the substrate 10 and the Mo layer 20 may be further increased by the transparent oxide electrode layer 22. Furthermore, when the see-through patterns 32a are formed in the Mo layer 20 through laser etching, the transparent oxide electrode layer 22 may reduce edge lifting and thus etching quality may be increased. In this case, a thickness of the Mo layer 20 may be equal to or less than half the thickness of the Mo layer 20 used as a single layer. The transparent oxide electrode layer 24 including the contact holes 28 as described above may increase the interfacial adhesion force between the Mo layer 20 and the chalcogenide absorber layer 40 and, at the same time, facilitate carrier transport.

As still another example, referring to FIG. 2C, the transparent oxide electrode layer 22 may be further deposited between the substrate 10 and the Mo layer 20 without the transparent oxide electrode layer 24 deposited on the Mo layer 20. That is, a back contact layer in which the transparent oxide electrode layer 22 and the Mo layer 20 are sequentially stacked on one another may be deposited on the substrate 10, and the see-through patterns 32a may be formed through laser etching as illustrated in FIG. 1B.

As described above, as a back contact layer, a single layer of the Mo layer 20 may be used or a double-layer or multi-layer structure in which a transparent conductive oxide layer such as an ITO layer is stacked on, under, or both on and under the Mo layer 20 may be used.

Referring to FIG. 1C, the chalcogenide absorber layer 40, the first buffer layer 50, the transparent electrode layer 60, and a grid 70 are sequentially deposited on the Mo layer 20.

The chalcogenide absorber layer 40 is deposited on the Mo layer 20 deposited on the substrate 10 and may use, for example, $Cu(In,Ga)(Se,S)_2$. A method of depositing the chalcogenide absorber layer 40 is already known and thus a detailed description thereof is not provided herein.

Then, the first buffer layer 50 and the transparent electrode layer 60 are sequentially deposited on the chalcogenide absorber layer 40, and the grid 70 is deposited on at least parts of the transparent electrode layer 60.

The first buffer layer 50 includes one of, for example, cadmium sulfide (CdS), zinc oxysulfide (Zn(O,S)), tin-doped zinc oxide, titanium-doped zinc oxide, intrinsic zinc oxide (i-ZnO), magnesium-doped zinc oxide, and magnesium-aluminum-doped zinc oxide. The transparent electrode layer 60 includes one of, for example, indium-doped tin oxide (ITO), aluminum-doped zinc oxide (AZO), indium-doped zinc oxide (IZO), gallium-doped zinc oxide (GZO), boron-doped zinc oxide (BZO), silver (Ag) nanowires, graphene, carbon nanotubes, Ag, magnesium (Mg):Ag alloy, gold (Au), and an electrode material having a metal oxide/thin metal/metal oxide (OMO) structure.

The types and compositions of the first buffer layer 50 and the transparent electrode layer 60 are selected based on the type of the chalcogenide absorber layer 40. Referring to FIG. 5B, for bandgap control, a second buffer layer 55 is additionally deposited between the first buffer layer 50 and the transparent electrode layer 60.

Referring to FIG. 1D, to form a see-through array 34, the chalcogenide absorber layer 40, the first buffer layer 50, and the transparent electrode layer 60 deposited on the see-through patterns 32a are removed by irradiating a laser beam from under the substrate 10 toward the transparent electrode layer 60. In this case, the see-through array 34 is formed according to the shape of the see-through patterns 32a. Depending on an etching method, the see-through array 34 may have the same shape as the see-through patterns 32a. Alternatively, the size of the see-through array 34 may be greater or less than the size of the see-through patterns 32a.

The see-through array 34 is formed using laser etching. The laser etching uses a laser beam having a wavelength band transmittable through the substrate 10 and absorbable into the chalcogenide absorber layer 40.

An intensity of the laser beam used to form the see-through array 34 may be less than threshold energy for simultaneously patterning the Mo layer 20, the chalcogenide absorber layer 40, the first buffer layer 50, and the transparent electrode layer 60. The intensity of the laser beam used to form the see-through array 34 may be greater than threshold energy for simultaneously patterning the chalcogenide absorber layer 40, the first buffer layer 50, and the transparent electrode layer 60 deposited on the see-through patterns 32a.

Thus, when the laser beam is used, a region where the Mo layer 20 remains may not be etched, and the chalcogenide absorber layer 40, the first buffer layer 50, and the transparent electrode layer 60 deposited on the see-through patterns 32a may be selectively removed.

When the see-through array 34 is formed, precise alignment with apertures etched from the Mo layer 20 to form the see-through patterns 32a is not required, and apertures may be selectively removed without any damage in the shape of patterns of the apertures by scanning a whole region of the substrate 10 or a region around the see-through patterns 32a by irradiating the laser beam onto a bottom surface of the substrate 10, i.e., another surface of the substrate 10 including the Mo layer 20.

As another example, when the see-through array 34 is formed, a plurality of see-through arrays 34 may be formed by increasing a diameter of the laser beam to cover the plurality of see-through array 34 and irradiating the laser beam once onto a whole region of the substrate 10 or a region around the see-through patterns 32a in a stitch manner within a range corresponding to the diameter of the laser beam.

Figure 3A:
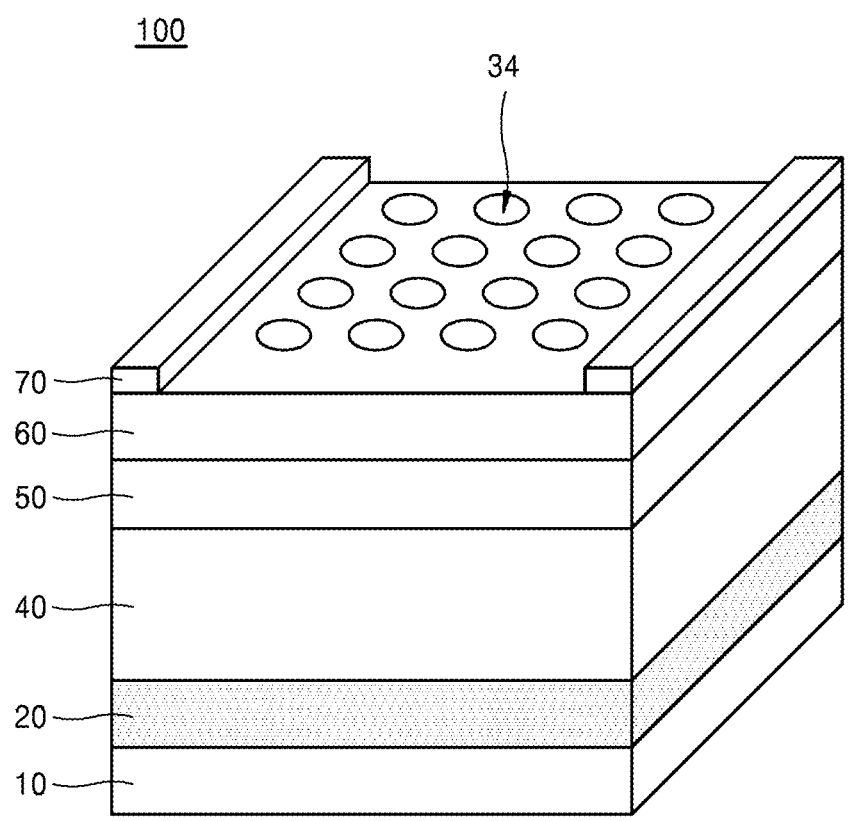
FIG. 3A is a perspective view of a see-through thin film solar cell according to an embodiment of the present invention.
Figure 3B:
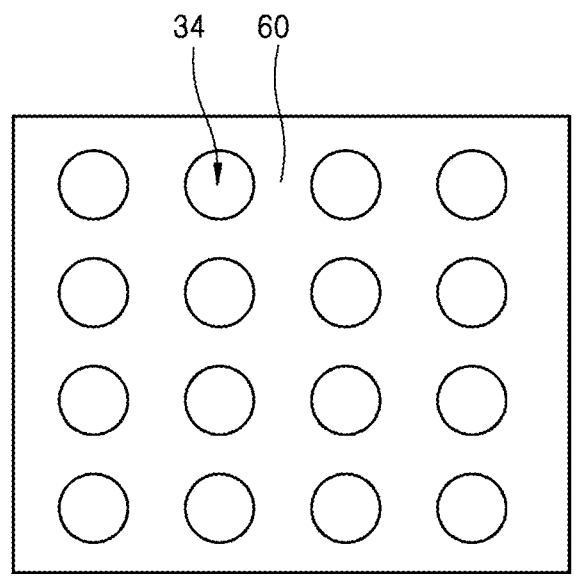
FIG. 3B is a top view of the see-through thin film solar cell illustrated in FIG. 3A.

FIG. 3A is a perspective view of the see-through thin film solar cell 100 according to an embodiment of the present invention, and FIG. 3B is a top view of the see-through thin film solar cell 100 illustrated in FIG. 3A.

Referring to FIGS. 3A and 3B, the see-through array 34 is formed not to overlap with the grid 70. The see-through array 34 penetrates through parts of the transparent electrode layer 60 of the thin film solar cell 100 to the Mo layer 20. The see-through array 34 is formed according to the shape of the see-through patterns 32a, and includes patterns of holes or lines. In this case, the see-through array 34 is formed at the same size as the see-through patterns 32a, and a diameter of the holes or a width of the lines is controlled to be equal to or less than 200 µm (and greater than 0 µm). Desirably, considering optical and aesthetic properties of the thin film solar cell 100, the see-through array 34 may be formed at a size equal to or less than 100 µm (and greater than 0 µm).

In this case, because only reduction in photocurrent corresponding to the see-through array 34 is caused, photovoltage, charge rate, and deterioration problems occurring when the see-through thin film solar cell 100 is implemented may be avoided.

The see-through array 34 may also be formed in a polygonal shape, e.g., a triangular shape, the shape is differently controlled depending on a beam diameter and a wavelength band, and the size of each pattern is controlled to be equal to or less than 200 µm (and greater than 0 µm). Herein, the size and shape of the see-through patterns 32a may be controlled to adjust the size of the see-through array 34.

Figure 4A:
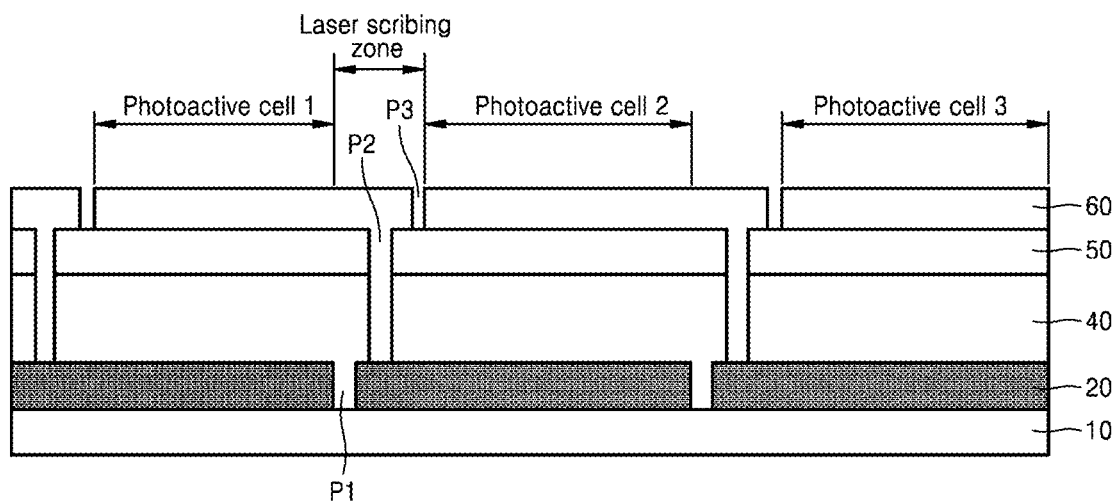
FIGS. 4A and 4B are cross-sectional views of a see-through thin film solar cell before and after a see-through array is etched, according to an embodiment of the present invention.
Figure 4B:
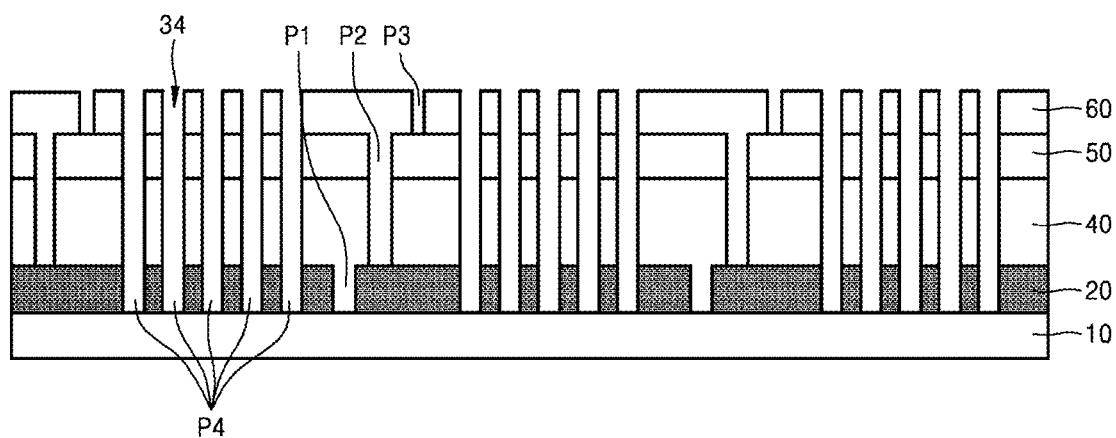
Figure 4C:
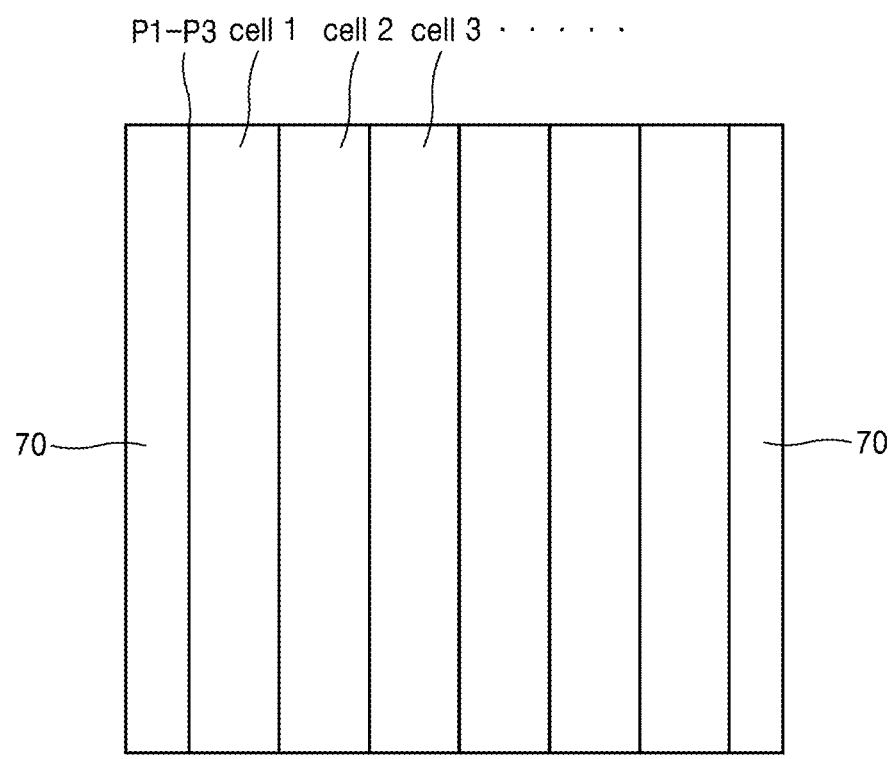
FIGS. 4C and 4D are top views of the see-through thin film solar cell before and after the see-through array is etched.
Figure 4D:
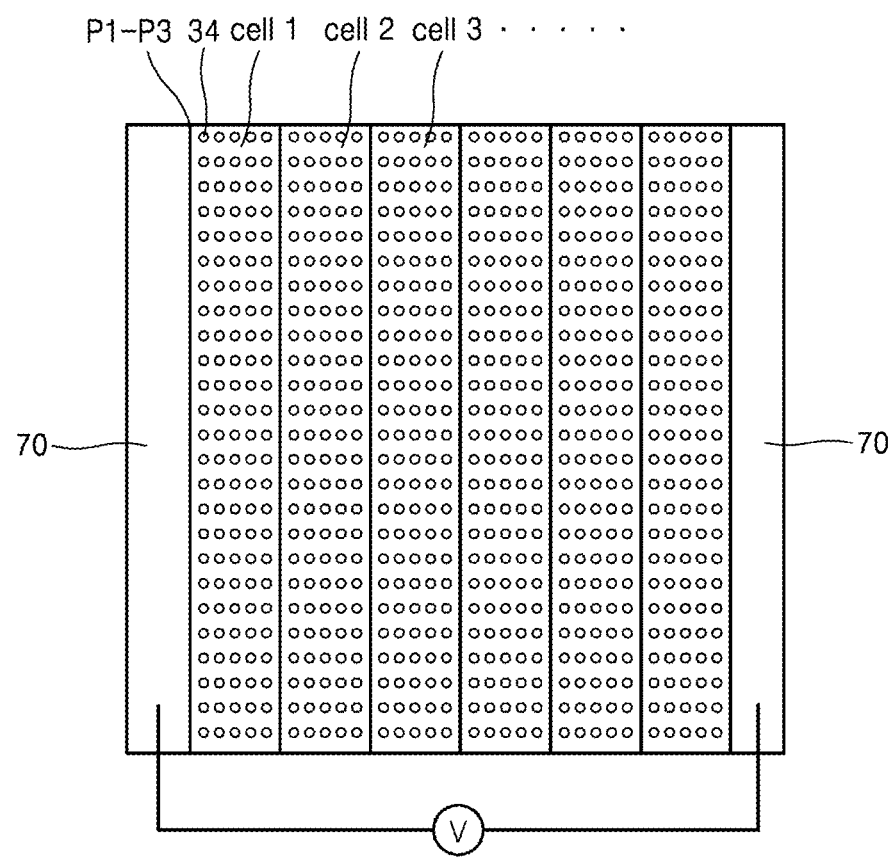

FIGS. 4A and 4B are cross-sectional views of the see-through thin film solar cell 100 before and after the see-through array 34 is etched, according to an embodiment of the present invention, and FIGS. 4C and 4D are top views of the see-through thin film solar cell 100 before and after the see-through array 34 is etched.

Referring to FIGS. 4A and 4C, the thin film solar cell 100 includes P1 scribing patterns P1, P2 scribing patterns P2, and P3 scribing patterns P3, and a plurality of cells C1, C2, C3, . . . connected in series to each other are defined by the P1, P2, and P3 scribing patterns.

The P1 scribing patterns P1 indicate a process for insulating portions of the Mo layer 20. The P2 scribing patterns P2 indicate a process for exposing the Mo layer 20 to connect neighboring cells on a single integrated module in series to each other. The transparent electrode layer 60 is connected to the Mo layer 20 through the P2 scribing patterns P2. The P3 scribing patterns P3 indicate a process for insulating portions of the transparent electrode layer 60.

Referring to FIGS. 4B and 4D, the see-through array 34 (P4) is formed not to overlap with the P1, P2, and P3 scribing patterns. Alternatively, the see-through array 34 may overlap with the P1, P2, and P3 scribing patterns. The see-through array 34 is illustrated in a circular shape in FIG. 4D, but may also be formed in a linear shape. The see-through array 34 may not be parallel with the P1, P2, and P3 scribing patterns, be connected or partially disconnected from an end to the other end of a module, and be formed in a band shape having a certain width.

The see-through thin film solar cell 100 implemented as described above may selectively control transmittance thereof based on the see-through array 34, i.e., an aperture ratio, without reducing photovoltage and fill factor. In addition, because only photocurrent is reduced in proportion to an aperture area, reduction in photovoltaic efficiency due to increased transmittance is small compared to a method of using an ultra-thin absorber layer.

Experimental examples will now be described to promote understanding of the present invention. However, the following Experimental examples are merely for better understanding of the present invention and the scope of the present invention is not limited thereto.

EXPERIMENTAL EXAMPLE 1

Figure 5A:
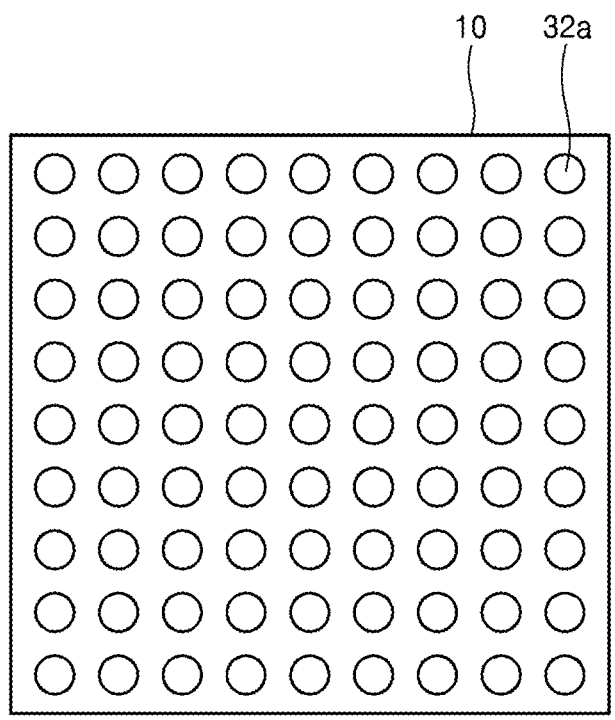
FIGS. 5A and 5B are top and cross-sectional views of a sample of Experimental example 1.
Figure 5B:
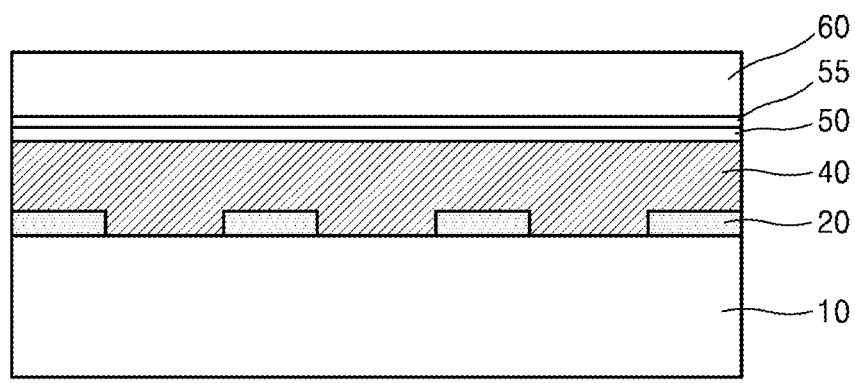

As illustrated in FIGS. 5A and 5B, a plurality of circular see-through patterns 32a were formed by depositing a Mo layer at a thickness of 0.5 µm on a soda lime glass (SLG) substrate and then etching the Mo layer by irradiating a 10 ps pulse laser beam having a wavelength band of 532 nm toward a SLG/Mo interface from a surface of the substrate opposite to the surface on which the Mo layer is located. Then, a Cu(In,Ga)Se$_2$ (CIGS) layer was deposited by using 3-stage co-evaporation at a substrate temperature of 450° C. For alkali doping, sodium fluoride (NaF) post-deposition treatment and potassium fluoride (KF) post-deposition treatment were performed at the end of the CIGS deposition process.

Then, a CdS layer was deposited by using chemical bath deposition (CBD), and an i-ZnO layer and an IZO layer were sequentially deposited by sputtering.

EXPERIMENTAL EXAMPLE 2

Figure 6A:
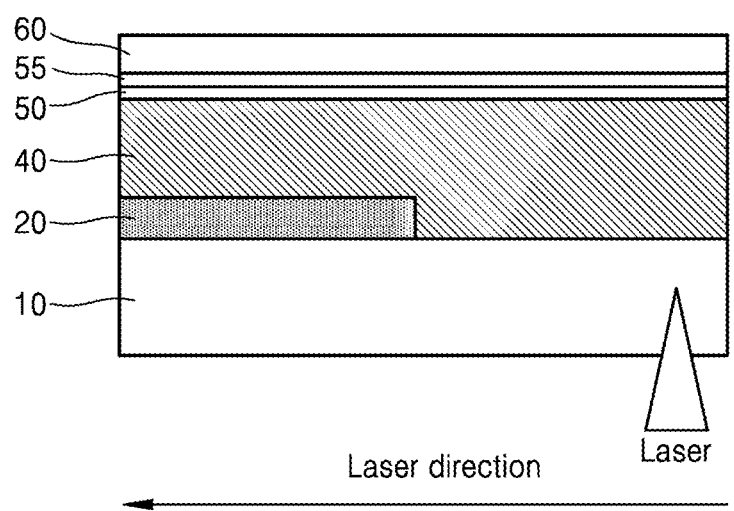
FIG. 6A is a cross-sectional view of a sample of Experimental example 2 and shows a laser etching direction (a laser beam is moved from a portion without a Mo back contact toward a portion with the Mo back contact)

The following test was conducted to check laser etching selectivity based on whether a metal back contact is present. As illustrated in FIG. 6A, a shadow mask having rectangular apertures was placed on a SLG substrate having a size of 30 mm×30 mm and then a Mo layer was deposited at a thickness of 0.5 µm. On the deposited Mo layer and the exposed substrate, a CIGS layer was deposited by using co-evaporation, a CdS layer was deposited by using CBD, and an i-ZnO layer and an IZO layer were sequentially deposited by using sputtering.

Then, a 10 ps pulse laser beam having a wavelength band of 532 nm was scanned at a frequency of 100 kHz in an arrow direction of FIG. 6A. In this case, a scanning speed was 7 m/s. The laser beam was irradiated as an oval beam having an aspect ratio of about 10 (e.g., minor axis: 21 um, major axis: 199 um). An average power of the laser beam was increased by 0.2 W from 1 W to 2 W.

Figure 5C:
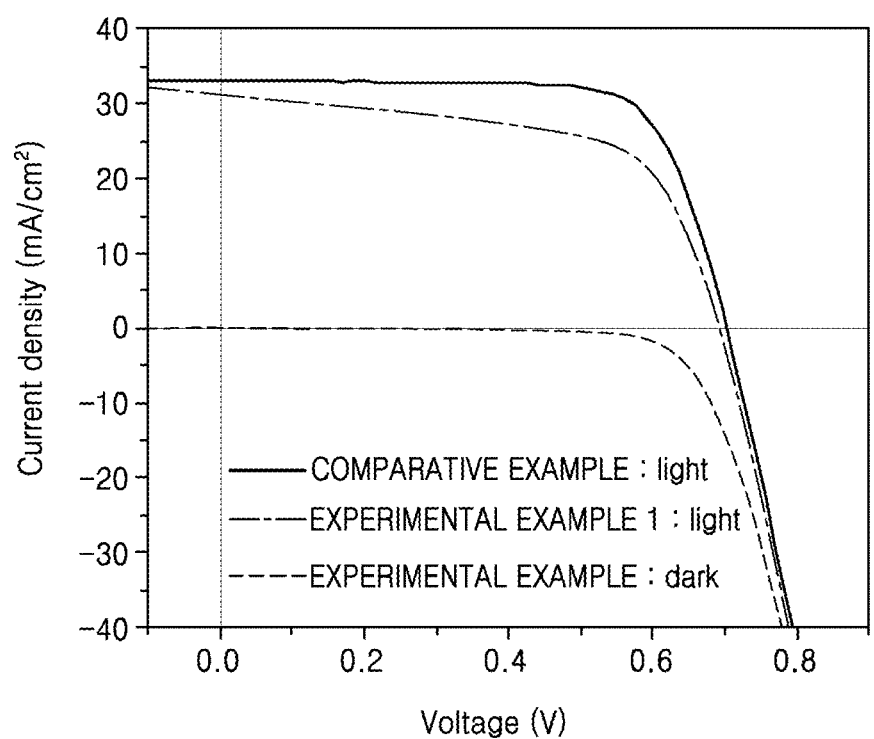
FIG. 5C is a graph showing a result of measuring photoelectric conversion efficiency of the sample of Experimental example 1.

FIG. 5C is a graph showing a result of measuring photoelectric conversion efficiency of the sample of Experimental example 1.

Referring to FIG. 5C, as indicated by a dark current-voltage curve, the sample of Experimental example 1 did not exhibit shunt loss. In a photocurrent-voltage curve of a thin film solar cell using a see-through array, photocurrent is strongly dependent on voltage because an electric field for transporting holes to a far Mo layer is required to collect photocurrent generated by a CIGS absorber layer in a region from which the Mo layer is removed. This voltage dependency is not a phenomenon caused by shunt loss of the solar cell, and disappears when the CIGS absorber layer and other thin film layers of the see-through array of the Mo layer are removed. That is, this result shows that, even when the see-through array of the Mo layer is formed, the thin film solar cell may be fabricated without reduction in photoelectric conversion efficiency.

Figure 6B:
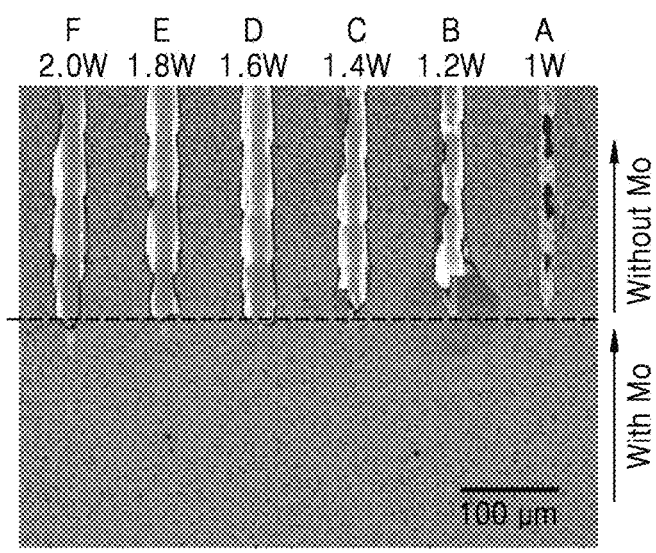
FIG. 6B is an optical microscope image showing a result of etching based on power of the laser beam applied to the sample of Experimental example 2.

FIG. 6A is a cross-sectional view of the sample of Experimental example 2 and shows a laser etching direction (a laser beam is moved from a portion without a Mo layer toward a portion with the Mo layer), and FIG. 6B is an optical microscope image showing a result of etching based on power of the laser beam applied to the sample of Experimental example 2.

Referring to FIGS. 6A and 6B, the CIGS layer and the other thin film layers were removed from a region without the Mo back contact but were not etched at all from a region with the Mo back contact in a range from 1 W to 2 W.

The IZO transparent electrode was slightly damaged at a power equal to or greater than 1.8 W. This test result proves that etching selectivity based on whether the Mo back contact is present is excellent because etching threshold energy with the Mo back contact is very high compared to the etching threshold energy without the Mo back contact.

Figure 7:
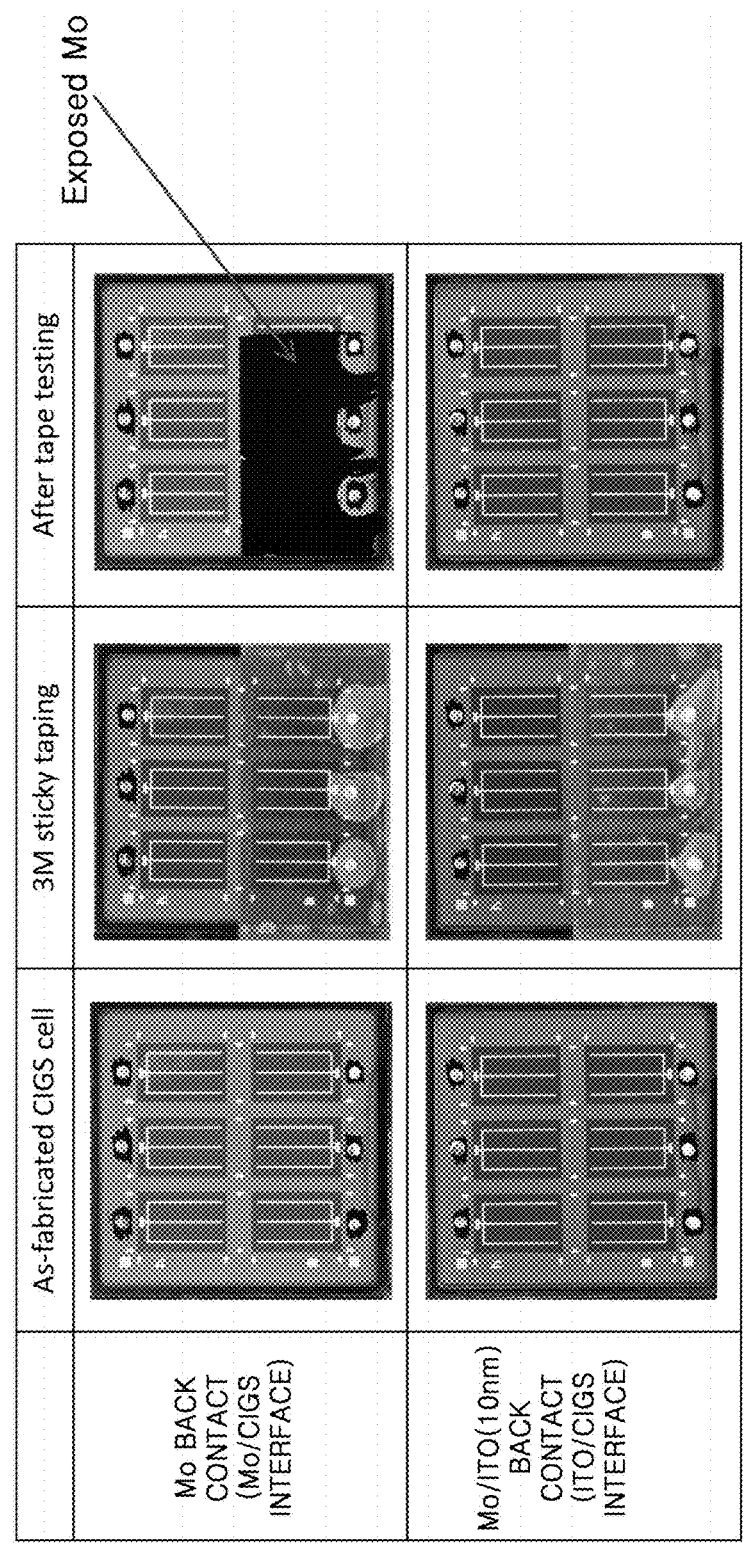
FIG. 7 is a table for comparing interfacial adhesion forces of a see-through thin film solar cell sample including a Mo back contact and a see-through thin film solar cell sample including a Mo/indium-doped tin oxide (ITO) back contact.

FIG. 7 is a table for comparing interfacial adhesion forces of a see-through thin film solar cell sample including a Mo back contact and a see-through thin film solar cell sample including a Mo/ITO back contact.

Referring to FIG. 7, a Mo layer having a thickness of 0.5 µm was deposited on a glass substrate. The Mo layer was deposited and then an ITO layer having a thickness of 10 nm was deposited on another glass substrate. A CIGS absorber layer, a CdS buffer layer, an i-ZnO layer, and an AZO transparent electrode were deposited and then a nickel (Ni)/Al metal grid was deposited on each of the two types (Mo and Mo/ITO) of the fabricated back contacts (As-fabricated CIGS cell). In order to compare interfacial adhesion forces between the back contact and the CIGS absorber layer, sticky tape (e.g., 3M tape) was attached to (3M sticky taping) and then removed from the surface of each solar cell (After tape testing).

As shown in the result of the adhesion force test, in the structure including the Mo layer as a back contact, the plurality of thin film layers was removed and the Mo layer was exposed. On the contrary, in the structure including the 10 nm ITO intermediate layer (Mo/ITO back contact), the solar cell structure was firmly maintained after the tape test. Consequently, the back contact/CIGS interfacial adhesion force was greatly increased due to addition of the ITO intermediate layer.

As described above, using a method of fabricating a see-through thin film solar cell according to the present invention, a chalcogenide thin film solar cell having both of high-efficiency photovoltaic performance and transmittance may be implemented.

Light-transmitting patterns having a line width equal to or less than 200 µm, and more specifically, equal to or less than 100 µm, may be formed through laser etching and are not easily recognizable by the naked eye, and thus product aesthetics of the see-through thin film solar cell may be improved. Furthermore, the method according to the present invention may be applied to a general thin film solar cell using a Mo back contact and thus a high-efficiency see-through thin film solar cell may be implemented. When a see-through array is removed, etching residues near pattern edges may be minimized due to high laser etching selectivity based on Mo back contact patterns. As such, light scattering may be reduced and thus excellent transmittance may be ensured.

In addition, using the method of fabricating a see-through thin film solar cell according to an embodiment of the present invention, it is expected that a see-through thin film solar cell having a photovoltaic efficiency of 15% or above at a visible light transmittance of 30% with respect to the highest efficiency of a current CIGS thin film solar cell may be implemented. This value corresponds to average daily power consumption of a house in an area of 15 m$^2$ in Korea (7.9 kWh, the Power Big Data Center, Korea Electric Power Corporation (KEPCO), 2018) when installed on windows of a building. However, the scope of the present invention is not limited to the above-described effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of fabricating a solar cell, the method comprising:
providing a transparent substrate comprising a molybdenum layer on a first surface;
forming see-through patterns by selectively removing at least parts of the Mo layer;
sequentially depositing a chalcogenide absorber layer, a buffer layer, and a transparent electrode layer on the patterned Mo layer; and
forming a see-through array according to a shape of the see-through patterned Mo layer by removing all of the chalcogenide absorber layer, the buffer layer, and the transparent electrode layer within the see-through patterned sections by radiating a laser beam onto the chalcogenide absorber layer of the see-through patterned sections and onto sections of Mo layer not removed in the step of forming see-through patterns, the irradiation occurring at a second surface of the substrate opposite to the first surface.

2. The method of claim 1, wherein the forming of the see-through patterns comprises selectively removing parts of the Mo layer through laser etching, and
wherein the laser etching uses a laser beam having a wavelength band transmittable through the substrate and absorbable into the Mo layer.

3. The method of claim 1, wherein the laser beam for the forming of the see-through array has a wavelength band transmittable through the substrate and absorbable into the chalcogenide absorber layer.

4. The method of claim 1, wherein an intensity of the laser beam used to form the see-through array is less than a threshold energy required to simultaneously pattern the Mo layer, the chalcogenide absorber layer, the buffer layer, and the transparent electrode layer.

5. The method of claim 1, wherein the intensity of the laser beam used to form the see-through array is greater than a threshold energy required for simultaneously patterning the chalcogenide absorber layer, the buffer layer, and the transparent electrode layer.

6. The method of claim 1, wherein the forming of the see-through array comprises scanning the laser beam over a whole region of the substrate or a region around the see-through patterns.

7. The method of claim 1, wherein the forming of the see-through array comprises scanning the laser beam across a whole region of the substrate, or a region including the see-through patterns in a stitch manner, within a range corresponding to the diameter of the laser beam.

8. The method of claim 1, wherein the see-through array comprises patterns of holes or lines.

9. The method of claim 8, wherein a diameter of the holes or a width of the lines is equal to or less than 200 micrometers and greater than 0 micrometers.

10. The method of claim 8, wherein a diameter of the holes or a width of the lines is equal to or less than 100 micrometers and greater than 0 micrometers.

11. The method of claim 1, wherein the see-through patterns are formed simultaneously with P1 scribing patterns for dividing the Mo layer into strips.

12. The method of claim 11, further comprising forming P2 scribing patterns for dividing the chalcogenide absorber layer and the buffer layer into strips offset with respect to the P1 scribing patterns by removing at least parts of the chalcogenide absorber layer and the buffer layer after the buffer layer is deposited.

13. The method of claim 12, further comprising forming P3 scribing patterns for dividing the transparent electrode layer into strips offset with respect to the P2 scribing patterns by removing at least parts of the transparent electrode layer after the transparent electrode layer is deposited.

14. The method of claim 13, wherein the see-through array is formed in a direction perpendicular to the P1, P2, and P3 scribing patterns.

15. The method of claim 13, wherein the see-through array is connected or partially disconnected from an end to another end of a module, and is formed in a band shape having a certain width.

16. The method of claim 1, wherein the buffer layer comprises cadmium sulfide (CdS), zinc oxysulfide (Zn(O, S)), tin-doped zinc oxide, titanium-doped zinc oxide, intrinsic zinc oxide (i-ZnO), magnesium-doped zinc oxide, or magnesium-aluminum-doped zinc oxide.

17. The method of claim 1, wherein the transparent electrode layer comprises indium-doped tin oxide (ITO), aluminum-doped zinc oxide (AZO), indium-doped zinc oxide (IZO), gallium-doped zinc oxide (GZO), boron-doped zinc oxide (BZO), silver (Ag) nanowires, graphene, carbon nanotubes, Ag, magnesium (Mg):Ag alloy, gold (Au), or an electrode material having a metal oxide/thin metal/metal oxide (OMO) structure.

18. The method of claim 1, further comprising depositing a first transparent oxide electrode layer on the Mo layer.

19. The method of claim 18, wherein the first transparent oxide electrode layer comprises ITO, fluorine-doped tin oxide (FTO), AZO, IZO, GZO, indium-gallium-doped zinc oxide, (Al,Mg)-doped ZnOx, BZO, or a combination thereof.

20. The method of claim 18, further comprising depositing a second transparent oxide electrode layer between the substrate and the Mo layer.

21. The method of claim 20, wherein the first transparent oxide electrode layer comprises one ITO, FTO, AZO, IZO, GZO, IGZO, (Al,Mg)-doped ZnOx, BZO, or a combination thereof.

22. The method of claim 18, wherein the first transparent oxide electrode layer comprises contact holes.

23. The method of claim 18, wherein the first transparent oxide electrode layer has a thickness of 0.1 nanometers to 5 nanometers.

24. The method of claim 1, further comprising depositing a transparent oxide electrode layer between the substrate and the Mo layer.

25. The method of claim 24, wherein the transparent oxide electrode layer comprises ITO, fluorine-doped tin oxide (FTO), AZO, IZO, GZO, indium-gallium-doped zinc oxide, (Al,Mg)-doped ZnOx, BZO, or a combination thereof.

* * * * *